US008923000B2

(12) United States Patent
Ganta Papa Rao Bala

(10) Patent No.: US 8,923,000 B2
(45) Date of Patent: Dec. 30, 2014

(54) SERVER CHASSIS

(75) Inventor: Kapil Rao Ganta Papa Rao Bala, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 316 days.

(21) Appl. No.: 13/459,915

(22) Filed: Apr. 30, 2012

(65) Prior Publication Data

US 2013/0286574 A1 Oct. 31, 2013

(51) Int. Cl.
*H05K 7/20* (2006.01)
(52) U.S. Cl.
USPC .......................................... 361/724; 361/725
(58) Field of Classification Search
None
See application file for complete search history.

(56) References Cited

U.S. PATENT DOCUMENTS

| | | | |
|---|---|---|---|
| 4,939,622 A * | 7/1990 | Weiss et al. ................... | 361/727 |
| 5,234,348 A | 8/1993 | Konsevich et al. | |
| 5,461,717 A * | 10/1995 | Notarianni et al. ........... | 710/303 |
| 6,434,018 B1 * | 8/2002 | Waltz ............................ | 361/796 |
| 6,648,429 B2 | 11/2003 | Chen et al. | |
| 6,882,525 B2 | 4/2005 | Paul et al. | |
| 7,068,498 B2 | 6/2006 | Bolich et al. | |
| 7,138,733 B2 | 11/2006 | Sanders et al. | |
| 7,193,845 B2 | 3/2007 | Titus | |
| 7,298,612 B2 | 11/2007 | Malone | |
| 7,359,186 B2 * | 4/2008 | Honda et al. ............. | 361/679.33 |
| 7,505,261 B2 | 3/2009 | Reasoner et al. | |
| 7,639,505 B2 * | 12/2009 | Chen et al. ..................... | 361/724 |
| 7,791,894 B2 | 9/2010 | Bechtolsheim | |
| 7,995,335 B2 * | 8/2011 | Chang et al. ............. | 361/679.33 |
| 8,075,070 B2 * | 12/2011 | Fan et al. .................... | 312/223.2 |
| 8,570,754 B2 * | 10/2013 | Li et al. ......................... | 361/727 |
| 2004/0252453 A1 | 12/2004 | Brooks et al. | |
| 2004/0252464 A1 | 12/2004 | Dobbs et al. | |
| 2004/0253842 A1 | 12/2004 | Barsun et al. | |
| 2005/0162830 A1 | 7/2005 | Wortman et al. | |
| 2011/0096484 A1 | 4/2011 | Hu et al. | |
| 2011/0096491 A1 | 4/2011 | Liu | |

FOREIGN PATENT DOCUMENTS

CN 101398705 A 4/2009

* cited by examiner

*Primary Examiner* — Anthony Q Edwards
(74) *Attorney, Agent, or Firm* — Dicke, Billig & Czaja, PLLC; Scott A. Lund

(57) ABSTRACT

A server structure includes a first housing to support a first server module configuration, and a second housing to support a second server module configuration such that the first housing and the second housing are interchangeably supported by a common chassis, and each have at least one set of common engagement features associated with a corresponding set of common engagement features of the common chassis.

12 Claims, 7 Drawing Sheets

SERVER CHASSIS

BACKGROUND

A computer server may include a chassis and one or more modules supported by the chassis. To accommodate different computing demands, the server may include a different number and/or type of modules. Reconfiguration of the server to support the different number and/or type of modules, however, may include disassembly (or at least partial disassembly) and reassembly of the chassis. Unfortunately, such disassembly and subsequent reassembly may compromise the structural integrity of the chassis. In addition, such disassembly and subsequent reassembly may be time consuming.

DETAILED DESCRIPTION

In the following detailed description, reference is made to the accompanying drawings which form a part hereof, and in which is shown by way of illustration specific examples in which the disclosure may be practiced. In this regard, directional terminology, such as "top," "bottom," "front," "back," "leading," "trailing," etc., is used with reference to the orientation of the Figure(s) being described. Because components of examples of the present disclosure can be positioned in a number of different orientations, the directional terminology is used for purposes of illustration and is in no way limiting. It is to be understood that other examples may be utilized and structural or logical changes may be made without departing from the scope of the present disclosure. The following detailed description, therefore, is not to be taken in a limiting sense, and the scope of the present disclosure is defined by the appended claims.

The present disclosure provides a server structure which accommodates different computing demands. More specifically, the server structure illustrated and described herein facilitates interchangeability of a number and/or type of modules and, therefore, facilitates reconfiguration of the server structure, without disassembly (and subsequent reassembly) of an internal framework of the chassis. As such, structural integrity of the chassis of the server structure may be maintained, and varying computing demands may be met.

Figure 1:
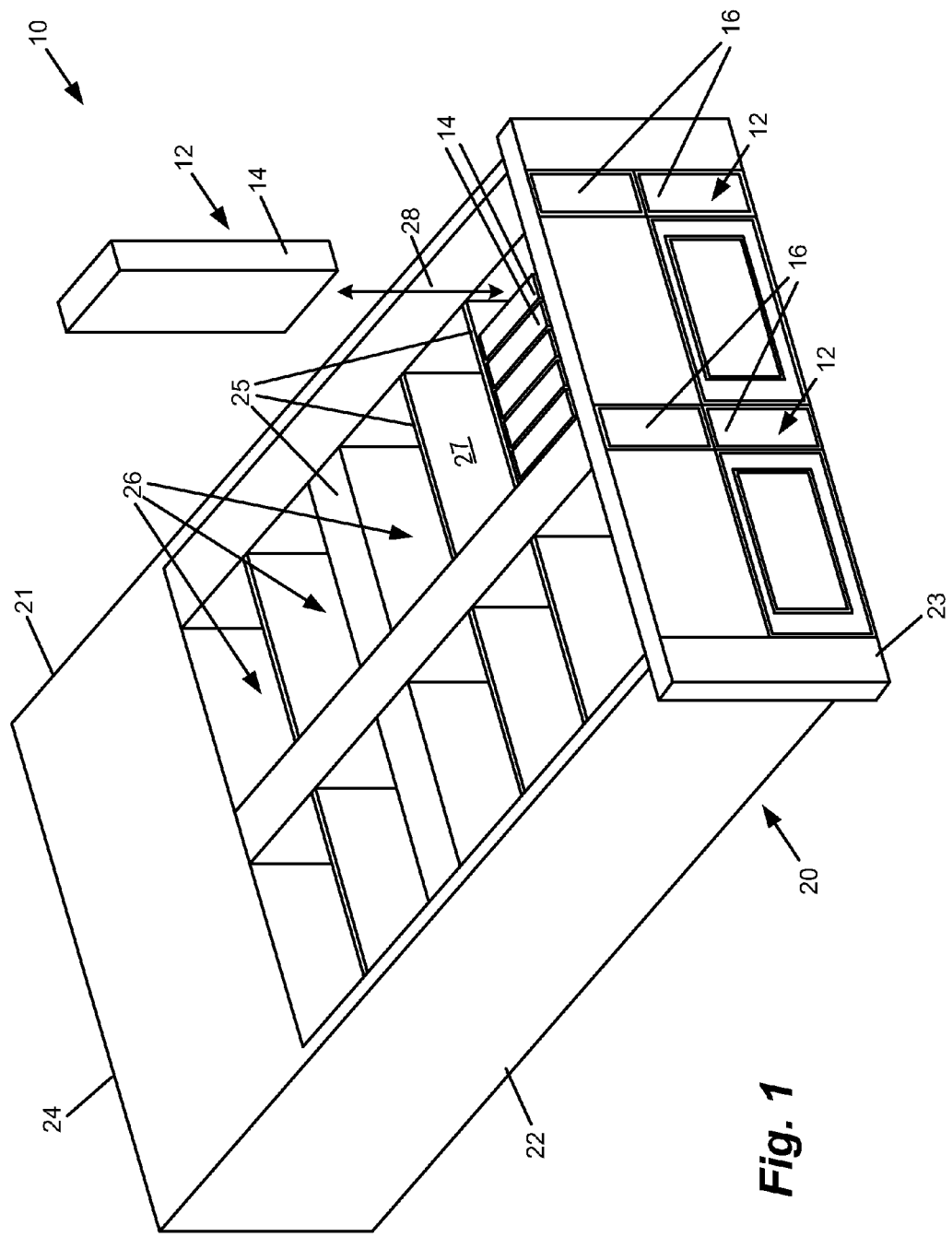
FIG. 1 is a schematic illustration of one example of a server structure.

FIG. 1 is a schematic illustration of one example of a server structure 10 for a computer system. Server structure 10 includes a chassis 20 to accommodate one or more modules 12 which provide a variety of functions. Examples of modules 12 include storage modules, server modules, switch modules, processor modules, memory modules, graphics modules, input/output (I/O) modules, power modules, or modules combining functions of one or more modules. In the example illustrated in FIG. 1, modules 12 include hard disk drives (HDD) 14 and nodes 16. Hard disk drives 14 and nodes 16 are supported by chassis 20, as described below.

Chassis 20 includes one or more structures to support and/or enclose modules 12. In one example, chassis 20 is rectangular in shape, and includes opposite sides 21 and 22, and opposite ends 23 and 24. In one example, end 23 represents a front of chassis 20, and end 24 represents a rear of chassis 20. The overall shape, size, and/or configuration of chassis 20 may vary depending upon the size, number, and/or type of modules supported or enclosed by chassis 20, and the intended function or operation of the computer system.

As illustrated in the example of FIG. 1, chassis 20 includes a plurality of panels or partitions 25 which form part of an internal framework to receive and support modules 12. In one example, partitions 25 are spaced within chassis 20 to form a plurality of bays 26 for modules 12. Bays 26 are arranged relative to each other, for example, in rows and/or columns. Although two columns of five rows each of bays 26 are illustrated in the example of FIG. 1, it is understood that chassis 20, as described below, may be configured with other numbers of columns and/or rows of bays 26, including one column and one row.

In one example, partitions 25 are oriented in a plane 27 substantially perpendicular to sides 21 and 22 of chassis 20, and substantially parallel with ends 23 and 24 of chassis 20. In addition, bays 26 are open in a direction substantially parallel with plane 27 (including, more specifically, a vertical axis of plane 27). Accordingly, and with reference to the orientation of FIG. 1, chassis 20 constitutes a top-load chassis with modules 12 loaded or inserted into chassis 20 in a substantially vertical direction represented by arrow 28. As such, the direction indicated by arrow 28 represents a direction substantially parallel with partitions 25 and plane 27.

In one example, bays 26 each include multiple slots for modules 12 such that multiple modules 12 are received within a single bay 26 of chassis 20. For example, and as illustrated in the example of FIG. 1, six modules are received within one bay 26. Although six modules are illustrated as being received within one bay 26, it is understood that bays 26 of chassis 20 may receive zero, one, or more than one module 12.

Figure 2:
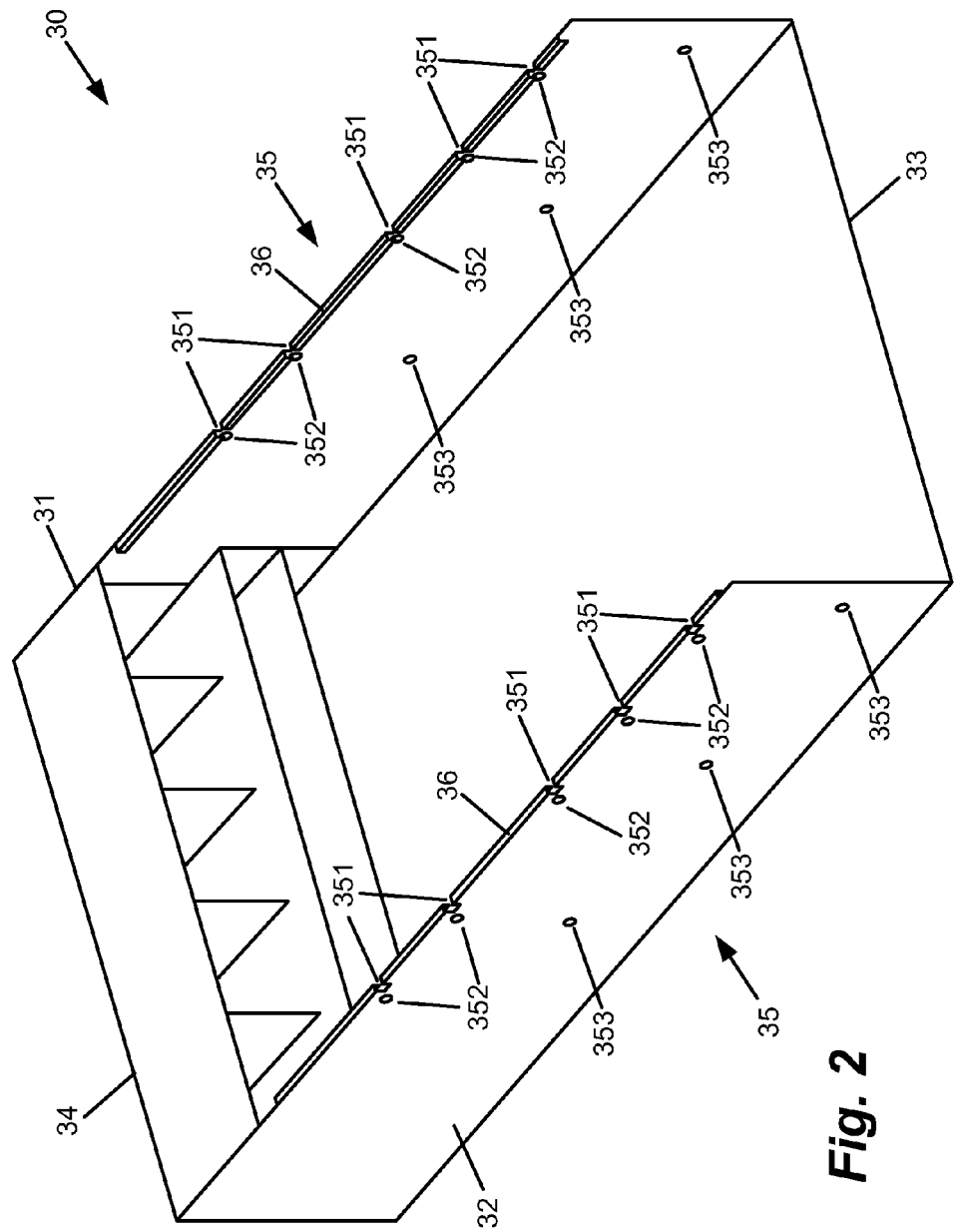
FIG. 2 is a schematic illustration of one example of a chassis base pan of a server structure.

FIG. 2 is a schematic illustration of one example of a chassis base pan 30 of chassis 20. Chassis base pan 30 provides a base or "shell" of chassis 20 and facilitates reconfiguration of server structure 10 to accommodate different computing demands. More specifically, and as described below, chassis base pan 30 interchangeably receives one or more chassis housings including, for example, interchangeable chassis housing 40 (FIGS. 4 and 5), interchangeable chassis housing 140 (FIG. 6), and interchangeable chassis housing 240 (FIG. 7) to support, for example, a different number and/or type of modules 12.

In one example, chassis base pan 30 is rectangular in shape, and includes opposite sidewalls 31 and 32, and opposite ends 33 and 34. In one example, end 33 represents a front of chassis base pan 30, and end 34 represents a rear of chassis base pan 30. In addition, in one example, both end 33 of chassis base pan 30 and a top of chassis base pan 30 are open.

Figure 3:
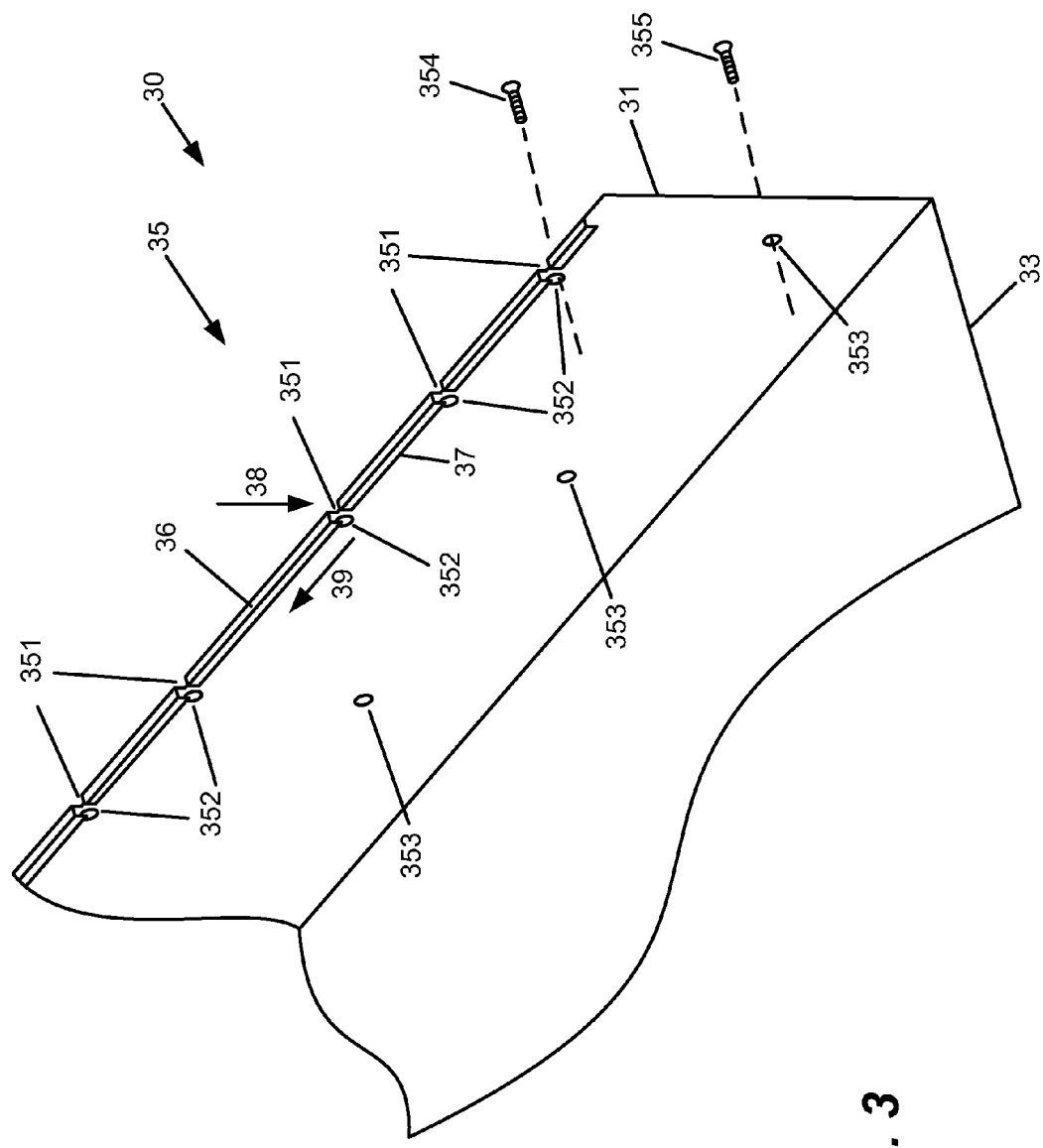
FIG. 3 is a schematic illustration of an enlarged portion of the chassis base pan of FIG. 2.

As illustrated in FIGS. 2 and 3, chassis base pan 30 includes a set of common engagement features 35 arranged to receive, mate with, or be associated with a corresponding set of common engagement features of one or more interchangeable chassis housings of chassis 20, as described below. In one example, common engagement features 35 include a series of engagement features provided along a top of sidewalls 31 and 32, and a series of engagement features provided along a side of sidewalls 31 and 32. More specifically, common engagement features 35 include a series of grooves or slots 351 spaced along a top of sidewalls 31 and 32, and a series of adjacent holes 352 spaced along a top of sidewalls 31 and 32. In addition, common engagement features 35 include a series of holes 353 spaced along a side of sidewalls 31 and 32.

In one example, as illustrated in FIG. 3, slots 351 are formed in a flange 36 provided along a top of sidewalls 31 and 32. As described below, slots 351 receive corresponding common engagement features of interchangeable chassis housings of chassis 20. In one example, the corresponding engagement features of the interchangeable chassis housings are received and inserted into slots 351 in a direction indicated by arrow 38, and slide along and under a lip 37 of flange 36 in a direction indicated by arrow 39. In one example, the direction indicated by arrow 39 is substantially perpendicular to the direction indicated by arrow 38. In one example, the direction indicated by arrow 39 is substantially parallel with a plane of sidewalls 31 and 32 and in a direction toward end 34, and the direction indicated by arrow 38 is substantially perpendicular to a bottom or base of chassis base pan 30.

Also as illustrated in FIGS. 2 and 3, a spacing of holes 352 corresponds to a spacing of slots 351 and a position of holes 352 is adjacent a position of slots 351. As such, in one example, after an interchangeable chassis housing of chassis 20 is positioned in chassis base pan 30, as further described below, holes 352 and holes 353 receive corresponding fasteners 354 and 355 to secure the interchangeable chassis housing in chassis base pan 30. In one example, each hole 352 is offset from an adjacent slot 351 in the direction indicated by arrow 39 such that holes 352 are aligned with corresponding engagement features of the interchangeable chassis housing after the interchangeable chassis housing is positioned in chassis base pan 30 (i.e., after the interchangeable chassis housing is inserted in the direction indicated by arrow 38, and slid in the direction indicated by arrow 39).

Figure 4:
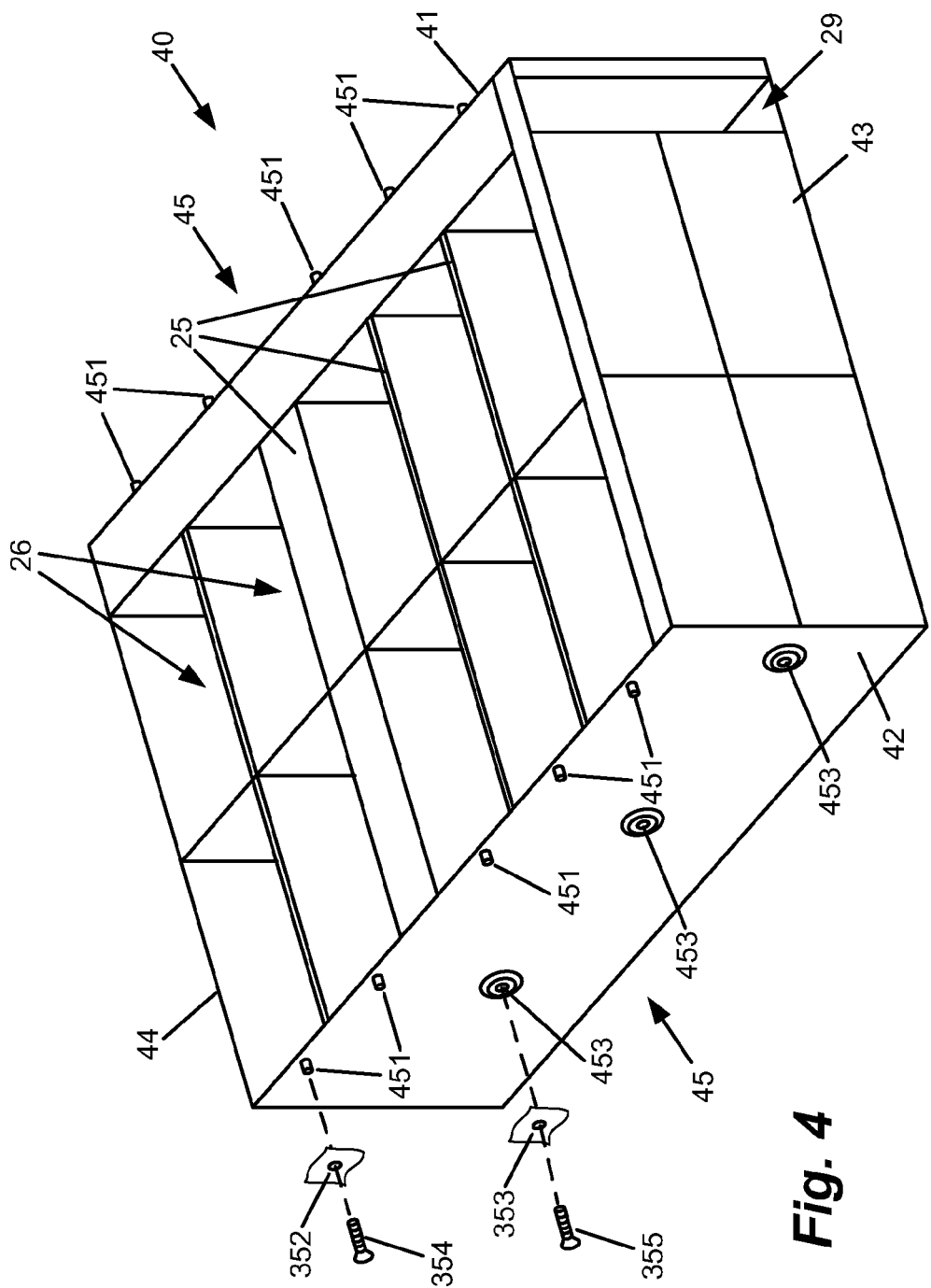
FIGS. 4 and 5 are schematic illustrations of one example of an interchangeable chassis housing to be supported by the chassis base pan of FIG. 2.
Figure 5:
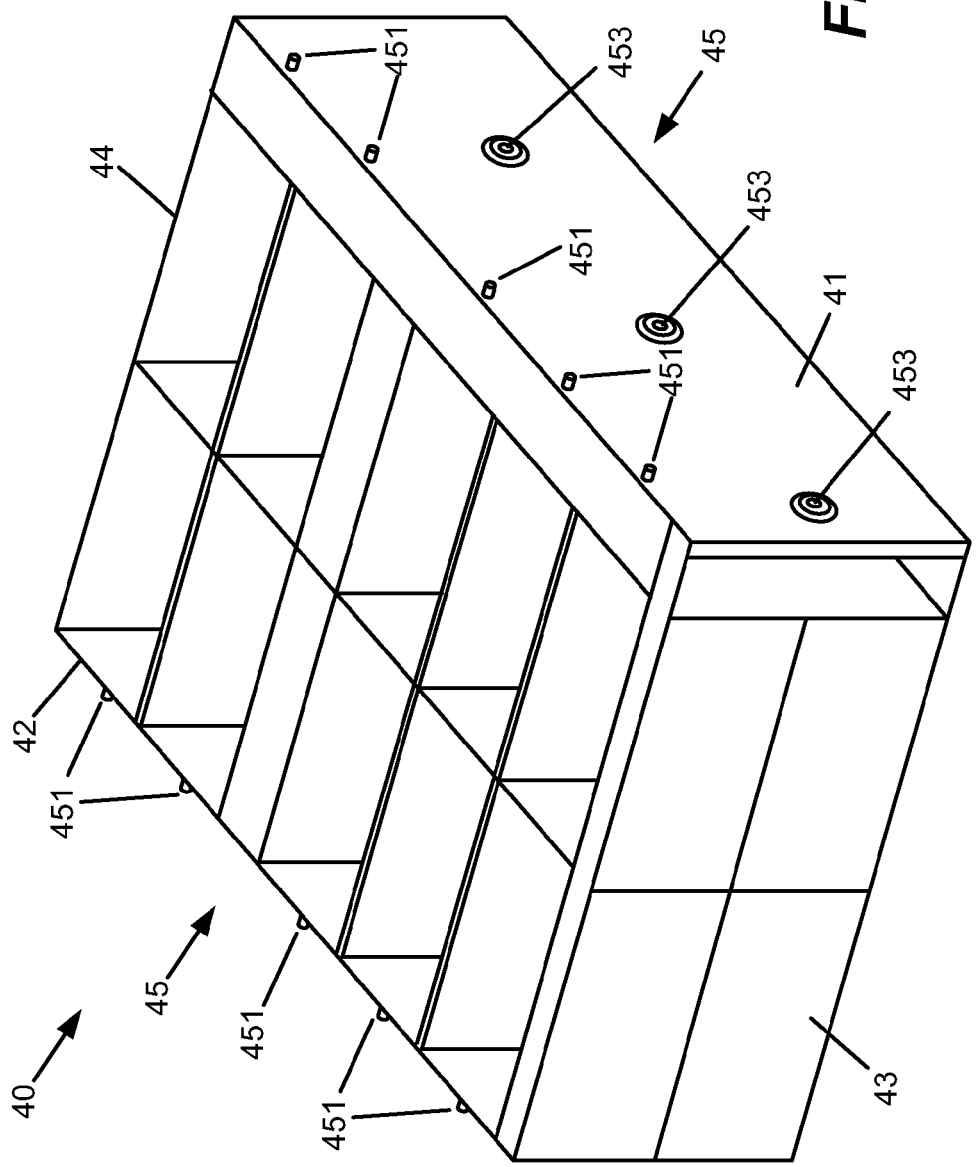

FIGS. 4 and 5 are schematic illustrations of one example of an interchangeable chassis housing 40 (referred to hereinafter as housing 40) of chassis 20. Housing 40 includes one example configuration of panels and partitions 25 and bays 26 of chassis 20 (FIG. 1) to accommodate one example configuration of modules 12 (FIG. 1). More specifically, in the illustrated example of FIGS. 4 and 5, housing 40 provides two columns of five rows each of bays 26 for hard disk drives 14 (FIG. 1), and provides one bay 29 for node 16 (FIG. 1).

In one example, housing 40 is rectangular in shape, and includes opposite sidewalls 41 and 42 and opposite ends 43 and 44. In one example, end 43 represents a front of housing 40, and end 44 represents a rear of housing 40.

As illustrated in FIGS. 4 and 5, housing 40 includes a set of common engagement features 45 arranged to receive, mate with, or be associated with corresponding common engagement features 35 of chassis base pan 30 (FIGS. 2 and 3). In one example, common engagement features 45 include a series of engagement features provided along a top of sidewalls 41 and 42, and a series of engagement features provided along a side of sidewalls 41 and 42. More specifically, common engagement features 45 include a series of standoffs or pins or studs 451 spaced along a top of sidewalls 41 and 42, and a series of holes 453 spaced along a side of sidewalls 41 and 42.

In one example, and with reference to FIG. 3, housing 40 is positioned in chassis base pan 30 such that studs 451 of housing 40 are received and inserted into slots 351 of chassis base pan 30 in the direction indicated by arrow 38, and housing 40 is slid relative to chassis base pan 30 in the direction indicated by arrow 39 such that studs 451 of housing 40 slide along and under lip 37 of flange 36 of chassis base pan 30.

In one example, and with reference to FIGS. 2 and 3, a spacing and position of holes 352 of chassis base pan 30 corresponds with a spacing and position of studs 451 of housing 40 such that studs 451 are aligned with holes 352 after housing 40 is received in chassis base pan 30. In addition, a spacing and position of holes 353 of chassis base pan 30 corresponds with a spacing and position of holes 453 of housing 40 such that holes 453 are aligned with holes 353 after housing 40 is received in chassis base pan 30.

Accordingly, in one example, with studs 451 of housing 40 aligned with holes 352 of chassis base pan 30, fasteners 354 are inserted through holes 352 and into studs 451 to secure housing 40 in chassis base pan 30. In addition, with holes 453 of housing 40 aligned with holes 353 of chassis base pan 30, fasteners 355 are inserted through holes 353 and into holes 453 to secure housing 40 in chassis base pan 30. In one example, fasteners 354 and 355 included threaded screws, and studs 451 and holes 453 include threaded bores to receive the threaded screws.

Figure 6:
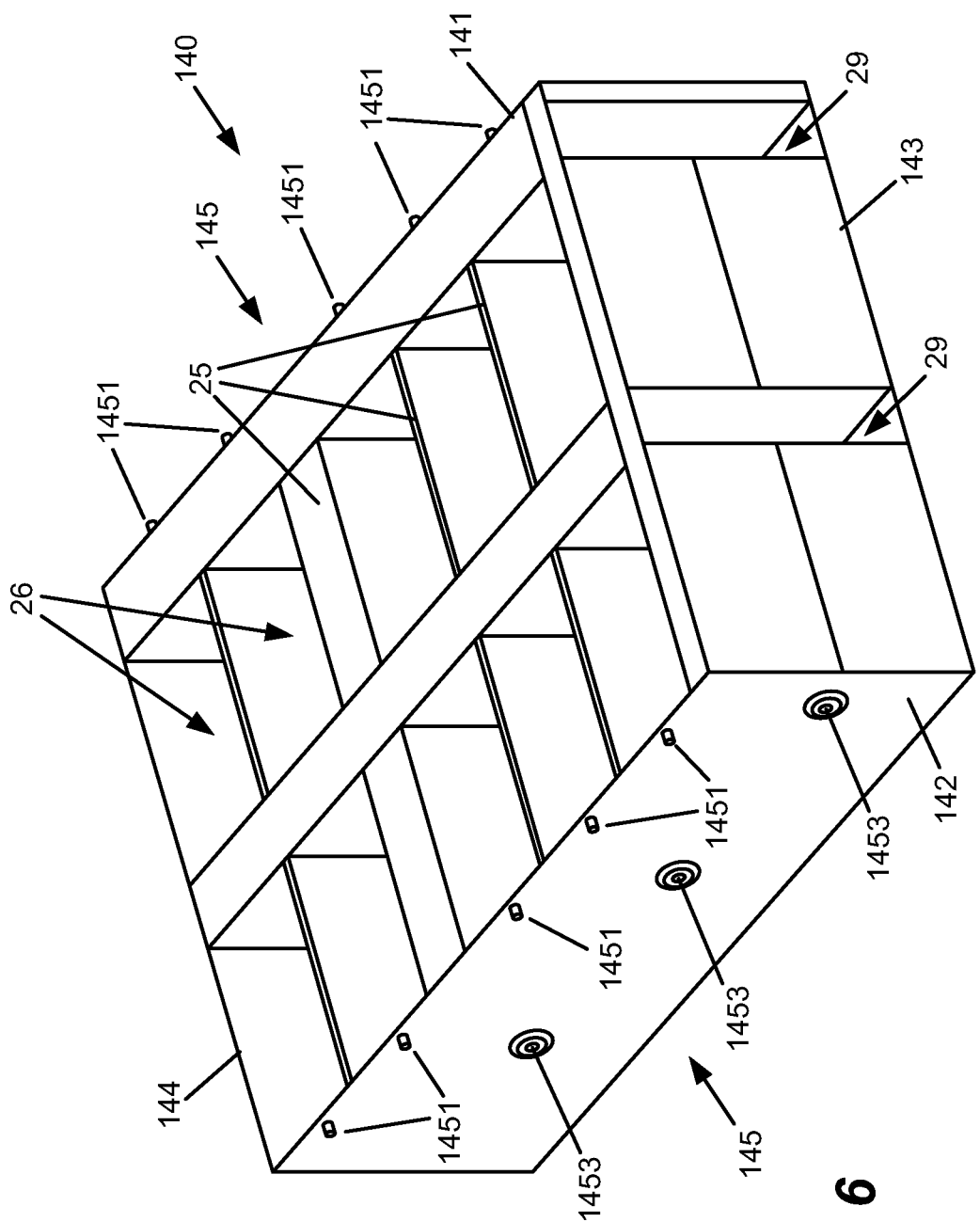
FIG. 6 is a schematic illustration of another example of an interchangeable chassis housing to be supported by the chassis base pan of FIG. 2.

FIG. 6 is a schematic illustration of another example of an interchangeable chassis housing 140 (referred to hereinafter as housing 140) of chassis 20. Housing 140 includes another example configuration of panels and partitions 25 and bays 26 of chassis 20 (FIG. 1) to accommodate another example configuration of modules 12 (FIG. 1). More specifically, in the illustrated example of FIG. 6, housing 140 provides two columns of five rows each of bays 26 for hard disk drives 14 (FIG. 1), and provides two bays 29 for nodes 16 (FIG. 1).

In one example, housing 140 is similar in shape to housing 40, and includes opposite sidewalls 141 and 142, and opposite ends 143 and 144. In one example, end 143 represents a front of housing 140, and end 144 represents a rear of housing 140.

As illustrated in FIG. 6, similar to housing 40, housing 140 includes a set of common engagement features 145 arranged to receive, mate with, or be associated with corresponding common engagement features 35 of chassis base pan 30 (FIGS. 2 and 3). In one example, common engagement features 145 include a series of engagement features provided along a top of sidewalls 141 and 142, and a series of engagement features provided along a side of sidewalls 141 and 142. More specifically, common engagement features 145 are the same as, similar to, or conform with common engagement features 45 and include a series of standoffs or pins or studs 1451 spaced along a top of sidewalls 141 and 142, and a series of holes 1453 spaced along a side of sidewalls 141 and 142.

In one example, and with reference to FIG. 3, housing 140, similar to housing 40, is positioned in chassis base pan 30 such that studs 1451 of housing 140 are received and inserted into slots 351 of chassis base pan 30 in the direction indicated by arrow 38, and housing 140 is slid relative to chassis base pan 30 in the direction by arrow 39 such that studs 1451 of housing 140 slide along and under lip 37 of flange 36 of chassis base pan 30.

In one example, and with reference to FIGS. 2 and 3, similar to housing 40, a spacing and position of holes 352 of chassis base pan 30 corresponds with a spacing and position of studs 1451 of housing 140 such that studs 1451 are aligned with holes 352 after housing 140 is received in chassis base pan 30. In addition, similar to housing 40, a spacing and position of holes 353 of chassis base pan 30 corresponds with a spacing and position of holes 1453 of housing 140 such that holes 1453 are aligned with holes 353 after housing 140 is received in chassis base pan 30.

Accordingly, in one example, and similar to housing 40, with studs 1451 of housing 140 aligned with holes 352 of chassis base pan 30, fasteners 354 are inserted through holes 352 and into studs 1451 to secure housing 140 in chassis base pan 30. In addition, similar to housing 40, with holes 1453 of housing 140 aligned with holes 353 of chassis base pan 30, fasteners 355 are inserted through holes 353 and into holes 1453 to secure housing 140 in chassis base pan 30.

Figure 7:
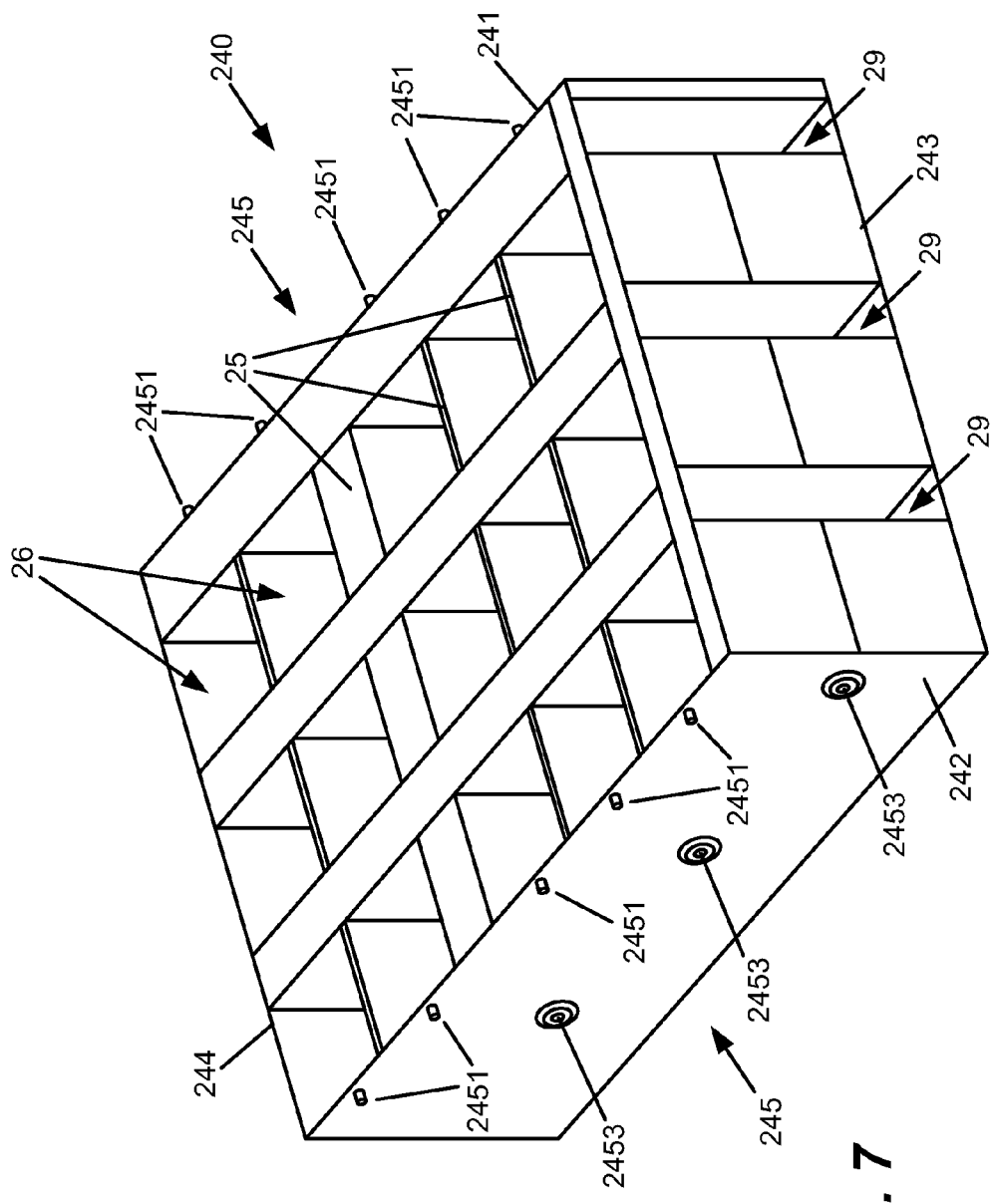
FIG. 7 is a schematic illustration of another example of an interchangeable chassis housing to be supported by the chassis base pan of FIG. 2.

FIG. 7 is a schematic illustration of another example of an interchangeable chassis housing 240 (referred to hereinafter as housing 240) of chassis 20. Housing 240 includes another example configuration of panels and partitions 25 and bays 26 of chassis 20 (FIG. 1) to accommodate another example configuration of modules 12 (FIG. 1). More specifically, in the illustrated example of FIG. 7, housing 240 provides three columns of five rows each of bays 26 for hard disk drives 14 (FIG. 1), and provides three bays 29 for nodes 16 (FIG. 1).

In one example, housing 240 is similar in shape to housing 40, and includes opposite sidewalls 241 and 242, and opposite ends 243 and 244. In one example, end 243 represents a front of housing 240, and end 244 represents a rear of housing 240.

As illustrated in FIG. 7, similar to housing 40, housing 240 includes a set of common engagement features 245 arranged to receive, mate with, or be associated with corresponding common engagement features 35 of chassis base pan 30 (FIGS. 2 and 3). In one example, common engagement features 245 include a series of engagement features provided along a top of sidewalls 241 and 242, and a series of engagement features provided along a side of sidewalls 241 and 242. More specifically, common engagement features 245 are the same as, similar to, or conform with common engagement features 45 and include a series of standoffs or pins or studs 2451 spaced along a top of sidewalls 241 and 242, and a series of holes 2453 spaced along a side of sidewalls 241 and 242.

In one example, and with reference to FIG. 3, housing 240, similar to housing 40, is positioned in chassis base pan 30 such that studs 2451 of housing 240 are received and inserted into slots 351 of chassis base pan 30 in the direction indicated by arrow 38, and housing 240 is slid relative to chassis base pan 30 in the direction by arrow 39 such that studs 2451 of housing 240 slide along and under lip 37 of flange 36 of chassis base pan 30.

In one example, and with reference to FIGS. 2 and 3, similar to housing 40, a spacing and position of holes 352 of chassis base pan 30 corresponds with a spacing and position of studs 2451 of housing 240 such that studs 2451 are aligned with holes 352 after housing 240 is received in chassis base pan 30. In addition, similar to housing 40, a spacing and position of holes 353 of chassis base pan 30 corresponds with a spacing and position of holes 2453 of housing 240 such that holes 2453 are aligned with holes 353 after housing 240 is received in chassis base pan 30.

Accordingly, in one example, and similar to housing 40, with studs 2451 of housing 240 aligned with holes 352 of chassis base pan 30, fasteners 354 are inserted through holes 352 and into studs 2451 to secure housing 240 in chassis base pan 30. In addition, similar to housing 40, with holes 2453 of housing 240 aligned with holes 353 of chassis base pan 30, fasteners 355 are inserted through holes 353 and into holes 2453 to secure housing 240 in chassis base pan 30.

The arrangement of server structure 10 illustrated and described herein facilitates reconfiguration of server structure 10 to accommodate different computing demands. More specifically, server structure 10 facilitates interchangeability of a number and/or type of modules 12 without disassembly (and subsequent reassembly) of an internal framework of chassis 20. For example, interchangeability of a number and/or type of modules 12 is facilitated without removal of partitions 25 (or other internal supports) of chassis 20.

As illustrated and described herein, reconfiguration of server structure 10 is accomplished by common engagement features 35 of chassis base pan 30 in combination with common engagement features 45 of housing 40, common engagement features 145 of housing 140, and/or common engagement features 245 of housing 240 to form common attachment points for chassis base pan 30 and housing 40, housing 140, and/or housing 240. Accordingly, varying computing demands (e.g., different demands of different consumers) may be met with a standard, common interchangeable system.

Although specific examples have been illustrated and described herein, it will be appreciated by those of ordinary skill in the art that a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:

1. A server structure, comprising:
a first housing to support a first server module configuration; and
a second housing to support a second server module configuration,
wherein the first housing and the second housing are interchangeably supported by a common chassis, and each have at least one set of common engagement features associated with a corresponding set of common engagement features of the common chassis, and
wherein the at least one set of common engagement features of the first housing and the second housing are provided along opposite sidewalls of each of the first housing and the second housing.

2. The server structure of claim 1, wherein the at least one set of common engagement features of the first housing and the second housing facilitate interchangeable insertion of the first housing and the second housing into the common chassis in a first direction and sliding of the first housing and the second housing relative to the common chassis in a second direction substantially perpendicular to the first direction.

3. The server structure of claim 1, wherein the at least one set of common engagement features of the first housing and the second housing comprises a series of studs extended from the opposite sidewalls of each of the first housing and the second housing to engage corresponding slots provided in opposite sidewalls of the common chassis.

4. The server structure of claim 1, wherein the at least one set of common engagement features of the first housing and the second housing comprises at least one series of holes provided in the opposite sidewalls of each of the first housing and the second housing to align with and receive fasteners through corresponding holes provided in opposite sidewalls of the common chassis.

5. A server structure, comprising:
a first housing to support a first configuration of server modules;
a second housing to support a second configuration of server modules; and
a chassis base to interchangeably receive the first housing and the second housing,
wherein the first housing, the second housing, and the chassis base each include at least one set of common attachment points to secure each of the first housing and the second housing in the chassis base, and wherein the at least one set of common attachment points are provided along opposite sidewalls of each of the first housing, the second housing, and the chassis base.

6. The server structure of claim 5, wherein the at least one set of common attachment points facilitates interchangeable insertion of each of the first housing and the second housing into the chassis base in a first direction and sliding of each of the first housing and the second housing relative to the chassis base in a second direction substantially perpendicular to the first direction.

7. The server structure of claim 5, wherein the at least one set of common attachment points are provided along a top of each of the opposite sidewalls of each of the first housing, the second housing, and the chassis base.

8. The server structure of claim 5, wherein the at least one set of common attachment points are provided along a side of each of the opposite sidewalls of each of the first housing; the second housing, and the chassis base.

9. The server structure of claim 5, wherein the at least one set of common attachment points comprises a series of common studs extended from the opposite sidewalls of each of the first housing and the second housing, and a corresponding series of common slots provided in the opposite sidewalls of the chassis base to receive the series of common studs.

10. The server structure of claim 5, wherein the at least one set of common attachment points comprises a series of common holes provided in the opposite sidewalls of each of the first housing and the second housing to align with and receive fasteners through a corresponding series of common holes provided in the opposite sidewalls of the chassis base.

11. A server chassis, comprising:
a chassis base pan to interchangeably receive a plurality of chassis housings each arranged to support a different configuration of server modules,
the chassis base pan having opposite sidewalls each including at least one set of common engagement features each to mate with corresponding common engagement features of each of the chassis housings,
wherein the at least one set of common engagement features comprises a first set of common engagement features provided along a top of each of the opposite sidewalls and a second set of common engagement features provided along a side of each of the opposite sidewalls.

12. The server chassis of claim 11, wherein the at least one set of common engagement features interchangeably facilitate insertion of each of the chassis housings into the chassis base in a first direction and sliding of each of the chassis housings relative to the chassis base in a second direction substantially perpendicular to the first direction.

* * * * *

UNITED STATES PATENT AND TRADEMARK OFFICE
CERTIFICATE OF CORRECTION

| | | |
|---|---|---|
| PATENT NO. | : 8,923,000 B2 | Page 1 of 1 |
| APPLICATION NO. | : 13/459915 | |
| DATED | : December 30, 2014 | |
| INVENTOR(S) | : Kapil Rao Ganta Papa Rao Bala | |

It is certified that error appears in the above-identified patent and that said Letters Patent is hereby corrected as shown below:

In the claims

In column 7, line 16 approx., in Claim 8, delete "housing;" and insert -- housing, --, therefor.

Signed and Sealed this
Twenty-fourth Day of November, 2015

Michelle K. Lee
*Director of the United States Patent and Trademark Office*